United States Patent

Heeb et al.

[11] Patent Number: 5,807,122
[45] Date of Patent: Sep. 15, 1998

[54] ADAPTOR FOR MOUNTING ON A CIRCUIT BOARD

[75] Inventors: Alfred Heeb; Klaus Wisskirchen, both of Berlin, Germany

[73] Assignee: Rudolf Schadow GmbH, Belin, Germany

[21] Appl. No.: 796,195

[22] Filed: Feb. 7, 1997

Related U.S. Application Data

[62] Division of Ser. No. 489,336, Jun. 12, 1995, Pat. No. 5,612,855.

[30] Foreign Application Priority Data

Jun. 14, 1994 [DE] Germany ........................ 44 20 698.4

[51] Int. Cl.$^6$ .................................................. H05K 1/00
[52] U.S. Cl. .............................. 439/83; 439/722; 439/56
[58] Field of Search ................... 439/83, 56, 722, 439/736, 660, 74, 876

[56] References Cited

U.S. PATENT DOCUMENTS

| | | | |
|---|---|---|---|
| 2,904,772 | 9/1959 | Artz | 439/83 |
| 4,409,641 | 10/1983 | Jakob et al. | 439/83 |
| 4,678,250 | 7/1987 | Romine et al. | 439/83 |
| 4,727,648 | 3/1988 | Savage, Jr. | 439/56 |
| 5,069,640 | 12/1991 | Wasimoto et al. | 439/736 |

FOREIGN PATENT DOCUMENTS

| | | | |
|---|---|---|---|
| 62-76539 | 4/1987 | Japan | 257/693 |

Primary Examiner—P. Austin Bradley
Assistant Examiner—Tho Dac Ta
Attorney, Agent, or Firm—Freilich Hornbaker Rosen

[57] ABSTRACT

An adapter (1, FIG. 1) is provided for the connection of an optoelectronic component such as an LED (light emitting diode) (2) to a circuit board (8) that lies in a case (34), wherein the adaptor positions the LED close to a window (32) in the top wall (30) of the case. The adapter has a pair of passages (4, 5) for holding conductors (11, 12) that connect terminals of the LED to SMD (surface mount device) contacts (6) that connect to the circuit board. The adapter holds the LED high enough above the circuit board, for the upper face (36) of the LED to lie in or close to the level of the window, so light from the LED can be readily seen from outside the case.

3 Claims, 2 Drawing Sheets

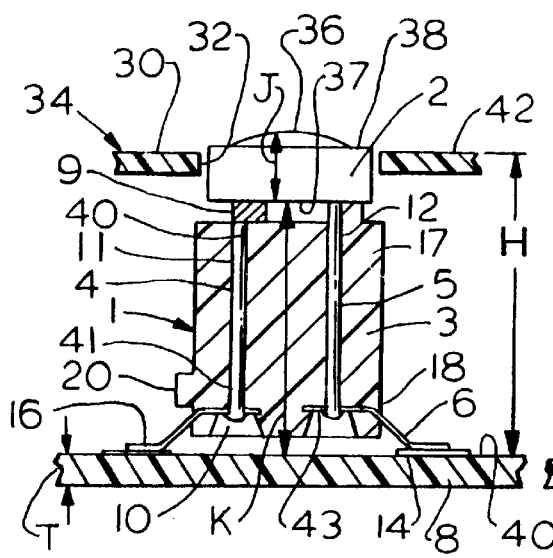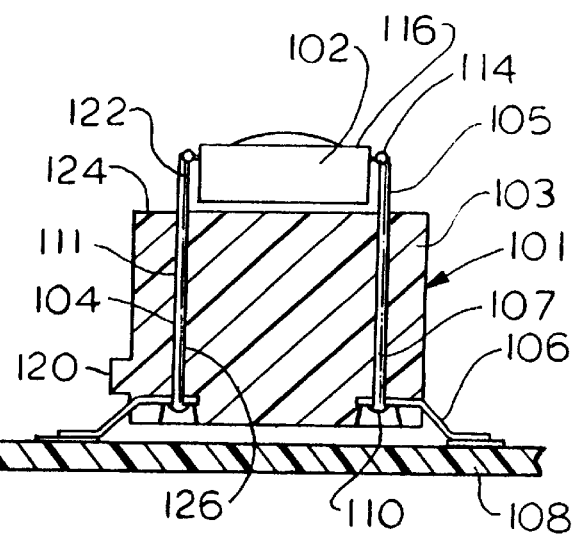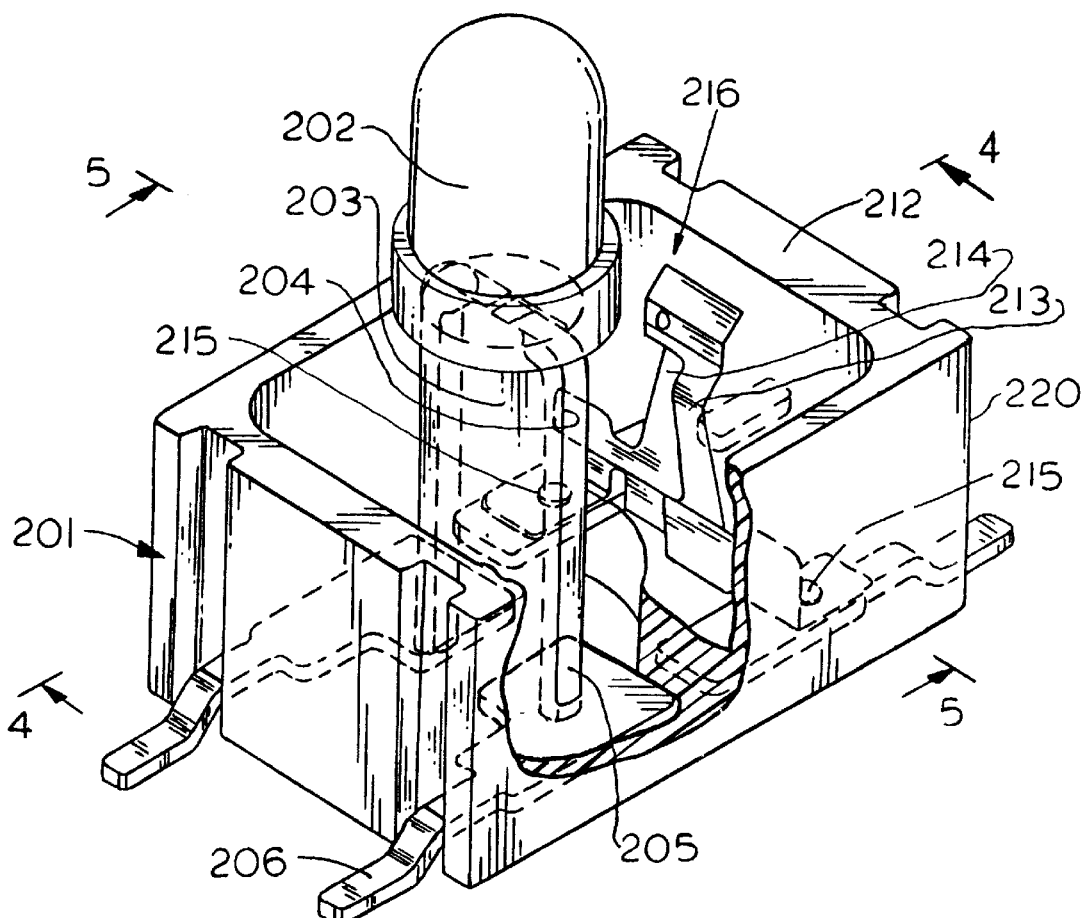

ADAPTOR FOR MOUNTING ON A CIRCUIT BOARD

CROSS-REFERENCE

This is a division of U.S. patent application Ser. No. 08/489,336 filed Jun. 12, 1995, now U.S. Pat. No. 5,612,855.

BACKGROUND OF THE INVENTION

This invention relates to an adapter for the electrical and mechanical connection of an optoelectronic component such as an LED (light emitting diodes) to a printed circuit board that lies in a case.

Two mounting technologies are commonly used for mounting electronic components on printed circuit boards. In a first technology, each component has at least two elongated leads or wires, which are inserted into plated-through holes of a circuit board and soldered in place thereat. The mounting of the wires connects the component both mechanically and electrically to the circuit board. For good mechanical mounting, the component housing lies close to the circuit board.

A second mounting technology, which has recently gained acceptance, is surface mount technology, which is often described as SMD (surface mounted device) technology. In SMD technology, SMD contacts on the components lie flat on the circuit board, and are soldered in place by wave soldering or the like. This technology avoids the need for drilled holes and allows components to be attached to both sides of the circuit board. Often, both drilled holes and surface mounting is used, because some components are not yet available as SMDs, and in some applications SMD mounting is more expensive. Important advantages of SMD technology are miniaturization of assembly, greater reliability of components, and lower cost large scale soldering methods as by machine wave soldering, vapor-phase soldering, reflow soldering, and infrared soldering.

Optoelectronic components such as LEDs (light emitting diodes) are sometimes available as SMDs. Where SMD technology is used, the plastic material which contains the LED chip must have a higher melting temperature to withstand soldering wherein components are fixed to a circuit board and then sent through a soldering furnace.

Because of miniaturization and absence of wire contacts, problems arise in the use of SMD for switches and indicators such as LEDs. It is often undesirable to position the light-emitting area of an LED or an actuator of a switch only a few millimeters above the circuit board surface, which is usually the case in SMD technology. Where the circuit board lies in an enclosure such as a case having a top wall lying a considerable distance above the circuit board, such as 10 mm or 15 mm or more, it is usually desirable to position a light emitting area of an LED close to a window in the top wall, and to position a switch actuator several mm above the wall. The same considerations apply to other sensors or actuators such as measuring devices, subminiature motors, and the like.

The object of the invention is to provide a simple adapter that enables selection of the positioning heights of components above a circuit board, while facilitating the electric connection of the component terminals to traces on the board.

SUMMARY OF THE INVENTION

In accordance with one embodiment of the present invention, an adapter is provided which can be electrically and mechanically mounted on a circuit board using SMD (surface mounted device) technology, as by machine wave soldering, and which holds a component at a selected height above the circuit board. One adapter for an LED (light emitting diode) has a pair of largely vertical passages through which conductors extend. The conductors can be wire leads of an LED that extend from the housing of the LED, with such leads extending down through the passages and connected to SMD leads fixed to the bottom of the adapter housing. Where the LED is a surface mount type, or otherwise has short terminals, the conductors can be bars with protruding upper ends on which short terminals of the LED mount.

The desired distance of the LED from the surface of the board is determined by the height of an adaptor housing. Different distances can be achieved by the use of different adapters. However, adapters are also conceivable which can be cut down to the required height, as by breaking off a part of the adapter housing.

In one application, the adapter forms a switch housing of a push button switch, with the housing containing SMD contacts, a push button switch and an LED. The soldering conditions (requirement to withstand high temperature) for the switch end LED are the same, since both are mounted on the adapter housing. Due to the SMD contacts, the circuit board on which the adapter is mounted does not require holes, and higher component densities can be realized.

In one adapter, recesses are provided at the bottom of the adapter housing, where connections are made between the SMD contacts and the lower ends of conductors that extend through the passages.

The novel features of the invention are set forth with particularity in the appended claims. The invention will be best understood from the following description when read in conjunction with the accompanying drawings.

BRIEF DESCRIPTION OF THE DRAWINGS

FIG. 1 is a sectional view of an adapter constructed in accordance with one embodiment of the invention, showing an optoelectronic component mounted thereon which has conventional wire leads or terminals.

FIG. 2 is a sectional view of an adapter in accordance with another embodiment of the invention, with an optoelectronic component thereon of the type that has short terminals.

FIG. 3 is a perspective, partly broken open view of an adapter of another embodiment of the invention, which holds a switch with inserted LED.

DESCRIPTION OF THE PREFERRED EMBODIMENTS

Figure 4:
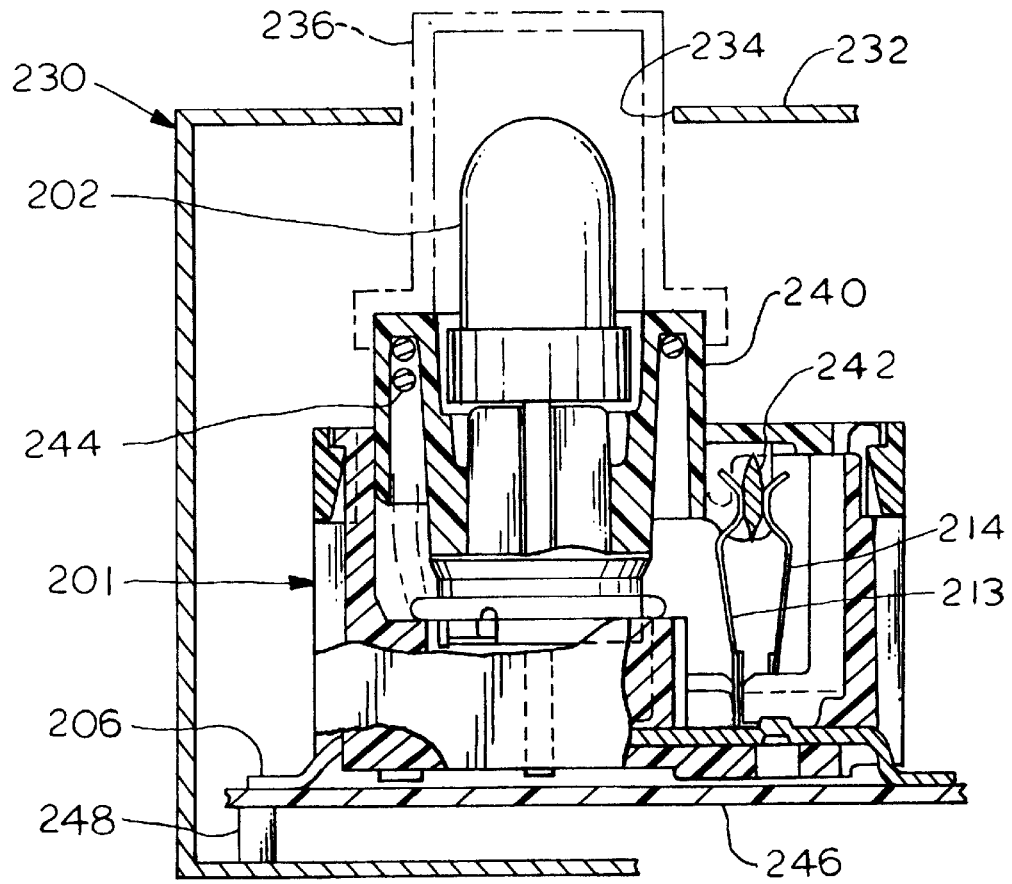
FIG. 4 is a sectional view taken on line 44 of FIG. 3.
Figure 5:
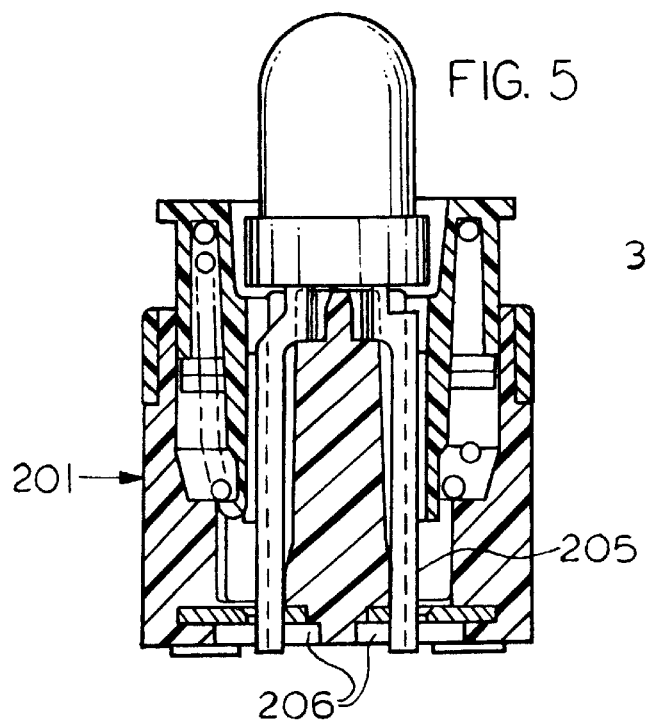
FIG. 5 is a sectional view taken on line 5—5 of FIG. 3.

FIG. 1 shows an adapter 1 for the electrical and mechanical connection of an optoelectronic component such as an LED (light emitting diode) 2, to a circuit board 8. The adapter has a dielectric base or housing 3 which is cylindrical, which has upper and lower portions 17, 18, and which has two vertically-extending passages 4, 5 with upper and lower ends 40, 41 for holding connecting elements or conductors 11, 12. The conductors 11, 12 are leads in the form of wires, that extend from the LED 2, with the upper ends of the leads extending into the adaptor housing 38 of the LED and fixed therein to form component terminals. The adaptor includes SMD (surface mounted device) contacts 6 that are embedded in the adaptor housing 3 at its lower portion that lies closest to the circuit board. SMD contacts have inner ends 43 lying at the lower ends 41 of the passages, and generally have outer ends 16 that lie flat against a trace 14 on a board surface. The wire leads 11, 12 have lower ends that are joined to the SMD contact inner ends 43 as by soldering. The LED has a component housing 38 that is placed on the top of the adapter housing 3, with the LED leads or wires 11, 12 extending down through the passages 4, 5. The wires are cut beforehand so their lower ends are just long enough to reach the SMD contacts 6. Recesses 10 in the underside of the housing facilitate permanently connecting the conductors 11, 12 to the SMD contacts 6. This can be effected by soldering, riveting, welding, laser welding, or the like. It is preferable that the component housing be able to stand high temperatures for use with SMD joining technology. That is, the LED should not be damaged when placed in a furnace that maintains a temperature equal to the melting temperature of low melting temperature solder. Such soldering in a furnace results in the lower ends of the wire leads being soldered to the SMD contacts 6, and causes the SMD contacts to be soldered to traces 14 on the upper surface of the circuit board, by melting of solder preforms.

The circuit board 8 and adapter and LED thereon, are mounted in a case 34 that has a top wall 30 with a window 32. It is often necessary to position the optically sensitive (e.g. light emitting) upper face 36 of the LED or other component so it lies close to the level of the window 32, as by positioning the substantially rigid component housing or body 38 in the window. The distance H between the upper face 40 of the circuit board and the top face 42 of the case top wall 30 varies, and may be controlled by the need to hold thick other items in the case or the need to hold tall other components on the circuit board. Although the component 2 has a relatively small height J between its upper face 36 and its bottom 37, the adapter provides an additional boost in height K for the component. Although the thickness T of a circuit board is usually about 2 mm (typically between 1 mm and 2.5 mm) the adapter positions the lower end of the component housing 38 at a height K which is a plurality of times greater than the board thickness T, with the height K usually being at least five times the board thickness T. The adaptor housing 3 is molded of a dielectric material such as a plastic, and is a block or substantially solid piece of plastic except for the passages 4,5 and the SMD contacts 6 are preferably molded in place, as illustrated.

Light emitting diodes 2 are sometimes marked on the cathode side in the area of the terminals by a shoulder, which facilitates fitting of the component on the top of the housing 3. In that case, the top of the passage on one side can be enlarged so the shoulder can fit into the enlargement The adapter forms a space 10 between the circuit board 8 and the underside of the housing, which permits later tilting of the adapter following soldering, so that the LED or other optoelectronic component, can be precisely aligned. The space 10 provides an area for soldering and for holding a bonding agent. The adapter housing is shown with a projection 20 on one side which aids in the use of directional components, as by indicating which terminal is to be grounded.

Figure 6:
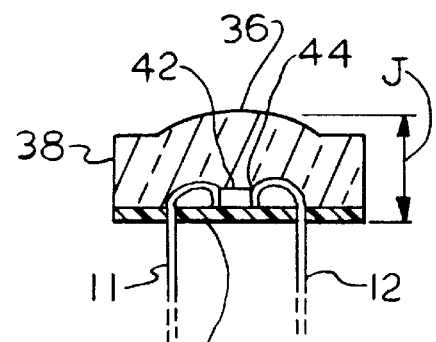
FIG. 6 is a sectional view of the optoelectronic component of FIG. 1.

FIG. 6 illustrates some details of the component 2, showing that it includes a light emitting chip 42 encased in transparent plastic material. The wire leads 11, 12 are fixed to the component housing 38, and are connected to internal contacts 44 of the chip 42. The wire leads 11, 12 form component terminals which are originally part of the component as it is originally manufactured.

In one example of an assembly of the construction of FIG. 1, the circuit board 8 has a thickness T of 2 mm, the case top face 42 lies a distance H of 25 mm above the board. The rigid component housing 3 has a height J of 4.5 mm, and the adaptor 1 has a height K of 21 mm between upper parts 9 on which the component housing rests, and the bottoms of the SMD contacts 6.

FIG. 2 shows an adapter 101 of another embodiment of the invention, which carries an optoelectronic component 102 such as an LED, which has short terminals 114 that extend from the component housing 116 by a distance that is less than the height of the component housing. The adapter 101 has a cylindrical dielectric housing 103 with two passages 104 for holding separate conductors 111, 105, and has an orientation-indicating projection 120. For this assembly, the elongated conductors 105, 111 are separate contact wires or bars (not originally part of the component 102) which are cast into the housing 103 and that form contact platforms. The conductors have upper ends 122 that protrude beyond the top 124 of the adapter housing 103 and that form contact platforms. The terminals 114 of the component are electrically and mechanically connected to the upwardly projecting portions or contact platforms 122 of the conductors, as by soldering or welding. The adapter has SMD contacts 106 that are electrically connected to the inner or lower ends 126 of the conductors at recesses 110 at the underside of the housing, with the recesses used in the same manner as those of the adapter of FIG. 1. The SMD contacts are soldered to traces on a circuit board 108.

FIG. 3 shows another adapter 201 which forms an adaptor housing 212 that holds a push button or other type of switch 216 and an LED 202 that indicates the state of the switch (closed or open). The housing includes a base 203 of largely cylindrical shape, on which the LED 202 is mounted. The LED is heat-resistant to enable contact soldering by placing the assembly with a circuit board in a furnace. The base 203 has two passages 204 in the form of grooves at opposite sides of the largely cylindrical base, with the passages being open at each side. Conductors 205 of the LED lie in the passages. Each conductor 205 is a lead that forms a terminal of the LED 202, and each conductor has a lower end connected to an SMD contact 206 of the adapter. The contacts 206 are partially embedded in a part of the adaptor housing that surrounds the base 203. A pair of switch contacts 213, 214 lie in a housing part 220 that surrounds the base. In this case, lower ends of the switch contacts can be joined by rivets 215 to lower ends of relevant SMD contacts 206. The adaptor has four SMD contacts 206, two for the switch 216 and two for the LED 202.

The base 203 holds the LED 202 at a considerable height above the bottoms of the SMD contacts 206 that mount on a circuit board, so the LED can be readily seen.

FIG. 4 shows the adapter 201 lying in a case 230 which has a top wall 232 with a window 234 therein. A translucent actuator indicated at 236 can depress a dielectric switch part 240 which carries a separator 242 that normally separates the contacts 213, 214, but which allows the contacts to engage each other when the actuator 236 is depressed. A spring 244 urges the actuator upwardly. The LED component 202 is held at a sufficient height above a circuit board 246, that light from the LED passes through the window 234 and translucent actuator 236 so the light can be readily seen. A circuit on the board energizes the LED only when the switch is in a particular state. The circuit board is held by mounts 248 to the case.

Although terms such as "top", "bottom", "vertical", etc. have been used in describing the invention as illustrated, it should be understood that the apparatus of the invention can be used in any orientation with respect to Earth's gravity.

Thus, the invention provides an adapter for holding a component, especially an optoelectric component such as an LED, over a circuit board, to electrically and mechanically connect the component to the circuit board while holding the component a considerable distance, usually much greater than the height of the component housing, from the upper surface of the circuit board. The adapter enables the component to lie close to a top wall of a casing in which the circuit board is mounted, to lie near a light-passing window in a top wall of the casing. The adapter housing has a plurality of largely vertically-extending passages, and has a plurality of SMD contacts at the housing lower portion that are adjoined to traces on the circuit board. A plurality of conductors each extends through one of the passages, with each conductor having an upper end connected to the component and a lower end connected to one of the SMD contacts. Each conductor can be part of the component and form a component terminal, in which case the conductors are usually flexible, elongated wires extending from the component housing and down through the adaptor housing passages to the SMD contacts. An alternative is where the conductors are not parts of the component, and where they may be molded in place in the dielectric housing. In that case, the upper ends of the conductors are joined, as by soldering, to exposed terminals on the component, and the conductors have lower ends joined, as by soldering or welding, to the SMD contacts.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An adaptor for mounting an optoelectronic component on a circuit board that lies within a case, comprising:

an adaptor housing having upper and lower portions, said housing comprises a single block of molded plastic dielectric material, said block having an outside surface and being substantially completely filled with said plastic material within said outside surface except for a plurality of vertical passages that extend substantially completely through said adaptor housing for holding conductors with each passage having upper and lower ends;

a plurality of conductors, each extending through one of said passages and having upper and lower ends;

a plurality of SMD contacts mounted on said lower portion of said housing with each SMD contact having an inner end lying at the lower end of a corresponding one of said passages and soldered thereat to the lower end of one of said conductors lying in the corresponding passage.

2. The adaptor described in claim 1 wherein:

said adaptor housing has a lower end with a bottom surface, said bottom surface having a plurality of recesses, with said passages and said SMD contacts being accessible within said recesses, and with said recesses each leading to a solder joint where one of said conductors is soldered to the inner end of one of said SMD contacts.

3. An optoelectric component and an adaptor for mounting said component on a circuit board that lies within a case, comprising:

an adaptor housing having upper and lower portions, said housing comprising a single block of molded plastic dielectric material, said block having an outside surface and being substantially completely filled with said plastic material within said outside surface except for a plurality of vertical passages that extend substantially completely through said adaptor housing, for holding conductors with each passage having upper and lower ends;

said component has a rigid body lying on said housing upper portion and said component has a plurality of flexible leads that each extend down through one of said vertical passages and that each has been cut so each lead lower end lies at the lower end of the corresponding passage;

a plurality of surface mounted device contacts mounted on said lower portion of said housing with each surface mounted device contact having a surface mounted device contact portion lying adjacent to one of said passages and mechanically and electrically connected in a fixed joint to a lower end of a corresponding lead at the lower end of a corresponding passage.

* * * * *